(12) United States Patent
Lohmüller

(10) Patent No.: US 6,488,779 B1
(45) Date of Patent: Dec. 3, 2002

(54) METHOD AND APPARATUS FOR CLEANING SUBSTRATES

(75) Inventor: Jürgen Lohmüller, Reutlingen (DE)

(73) Assignee: Steag MicroTech GmbH (DE)

(*) Notice: Subject to any disclaimer, the term of this patent is extended or adjusted under 35 U.S.C. 154(b) by 0 days.

(21) Appl. No.: 09/958,866
(22) PCT Filed: Mar. 16, 2000
(86) PCT No.: PCT/EP00/02339
§ 371 (c)(1), (2), (4) Date: Dec. 13, 2001
(87) PCT Pub. No.: WO00/61306
PCT Pub. Date: Oct. 19, 2000

(30) Foreign Application Priority Data

Apr. 12, 1999 (DE) .......................... 199 16 345

(51) Int. Cl.$^7$ .................................. B08B 3/04
(52) U.S. Cl. ................ 134/6; 134/2; 134/5; 134/7; 134/9; 134/11; 134/15; 134/19; 134/26; 134/30; 134/31; 134/32; 134/34; 134/36; 134/37; 134/42; 134/99.1; 134/100.1; 134/153; 134/122 R; 134/902; 510/175
(58) Field of Search ................ 134/5, 6, 7, 9, 134/15, 11, 26, 2, 32, 31, 34, 36, 42, 37, 99.1, 100.1, 153, 122 R, 902, 19, 30; 510/175

(56) References Cited

U.S. PATENT DOCUMENTS

| 5,378,312 A | * | 1/1995 | Gifford et al. ................ 134/7 |
| 5,651,834 A | * | 7/1997 | Jon et al. ..................... 134/26 |
| 5,928,434 A | * | 7/1999 | Goenka ........................ 134/10 |
| 5,964,952 A | * | 10/1999 | Kunze-Concewitz ..... 134/103.2 |

* cited by examiner

Primary Examiner—Sharidan Carrillo
(74) Attorney, Agent, or Firm—R W Becker & Associates; R W Becker

(57) ABSTRACT

A method of cleaning substrates is provided. Prior to, during or prior to and during a cleaning process, fluid is applied to a substrate surface to form a fluid film thereon. Ice crystals are introduced into the fluid film on the substrate surface. The ice crystals have a temperature that is lower than the temperature of the fluid such that the fluid changes the ice crystals into a gaseous state to form a pulse generated in the fluid film. The depth of penetration of the ice crystals into the fluid film is controlled such that the ice crystals do not strike the substrate surface. The substrate surface is cleaned with the pulse.

10 Claims, 2 Drawing Sheets

METHOD AND APPARATUS FOR CLEANING SUBSTRATES

BACKGROUND OF THE INVENTION

The present invention relates to a method and an apparatus for cleaning substrates, especially semiconductor wafers, according to which prior to and/or during the cleaning process, a fluid is applied to the substrate.

Such an apparatus is known, for example, from WO 96/10463. With this apparatus, a water film is applied to the substrate surface that is to be cleaned, and simultaneously or subsequently steam is conveyed onto the surface that is to be cleaned in a directed manner via a nozzle. The steam rapidly cools in the water film, whereby small steam bubbles implode and thereby generate a pulse in the water film that loosens the particles from the surface that is to be cleaned.

With this known apparatus, particles that strongly adhere to the surface that is to be cleaned can remain if the pulse is not sufficient to dislodge such particles. Furthermore, the apparatus requires a steam generator that increases the overall size of the apparatus. In addition, the steam comes into contact with metal within the steam generator and in the subsequently arranged components that convey media, so that there exists a danger of contamination of the substrate that is to be cleaned with metal ions.

Reference is also made to U.S. Pat. No. 5,651,834, which discloses a method for cleaning printed circuit boards. With this method, a thin water film is applied to a side of the circuit board that is to be cleaned. Subsequently, the side of the circuit board that is to be cleaned is bombarded with ice crystals that pass through the water film and strike the circuit board surface in order to clean the same. The water film has the function of diverting electrical charges that occur during the bombardment with ice crystals so that these charges do not damage the printed circuit boards.

Proceeding from the known apparatus, it is an object of the present invention to provide an apparatus and a method which, in a straightforward and economical manner, permit a reliable cleaning of substrates without the danger of damaging the same.

SUMMARY OF THE INVENTION

The object is inventively realized with a method for cleaning substrates, especially semiconductor wafers, according to which prior to and/or during the cleaning process a fluid is applied to the substrate, and ice crystals are introduced into the fluid located on the substrate, in that the depth of penetration of the ice crystals into the fluid is controlled in order to achieve a precise pulse generation and hence a precise cleaning. By controlling the depth of penetration of the ice crystals, it is furthermore possible to prevent the ice crystals from striking the substrate surface that is to be cleaned and thereby damaging such surface, since prior to striking the surface the ice crystals change into the gaseous state. Due to the large temperature difference between the ice crystals and the fluid, the ice crystals explosively change into the gaseous state. The thereby generated pulse, which is considerably greater than the pulse generated by the implosion of small steam bubbles, dislodges particles from the substrate surface that is to be cleaned. To carry out the inventive method, it is merely necessary to have a fluid feed line as well as a feed line for a gas that is under high pressure, so that the apparatus required for carrying out the method has a small size. In particular, for the cleaning of semiconductor wafers, which is generally effected in clean rooms, it is important to the extent possible to use apparatus having small dimensions, since clean rooms generate considerable cost not only during the manufacture but also during operation. Since it is necessary to provide only a feed line for the fluid and for a gas that is under high pressure, the components that convey the media can be made without metal, so that the danger of contaminating the substrate with metal ions can be precluded. Furthermore, the size and temperature of the ice crystals, and hence the magnitude of the pulse that is generated when the crystals change into the gaseous state, are easy to control, as a result of which on the whole a good control of the cleaning process results.

In order to control the magnitude of the pulse that reaches the surface of the substrate, the thickness of a fluid layer on the substrate and/or the temperature of the fluid are advantageously controlled. As a consequence of the thickness of the fluid layer, the distance between the source of the pulse and the surface of the substrate, and hence the strength of the pulse at the substrate surface, can be set. By controlling the fluid temperature, the intensity of the change of the ice crystals into the gaseous state, and hence the magnitude of the pulse, can be varied.

Pursuant to a further specific embodiment of the present invention, the size and/or temperature of the ice crystals are controlled, both of which determine the force of the pulse that is generated during the change of the ice crystals into the gaseous state.

Pursuant to a preferred specific embodiment of the present invention, the ice crystals are preferably directed at an angle onto the substrate in order to prescribe a direction of cleaning. The ice crystals are advantageously produced in at least one ice nozzle that is directed against the substrate. In so doing, during the cleaning a relative movement is advantageously produced between the ice nozzle and the substrate in order to ensure a cleaning of the entire substrate surface. Pursuant to one specific embodiment, the substrate and/or the ice nozzle is moved linearly. The substrate is advantageously furthermore rotated, so that loosened particles are moved out of the region of the wafer by the centrifugal force that results due to the rotation.

Pursuant to a further specific embodiment of the present invention, the substrate is inclined relative to the horizontal during the cleaning process in order to ensure that the fluid film and the loosened particles constantly flow off.

The fluid is advantageously deionized water, and the ice crystals are preferably $CO_2$, since $CO_2$ sublimates at normal pressures.

The object of the present invention is realized in an apparatus for cleaning substrates, especially semiconductor wafers, that includes a device for applying a fluid to the substrate, by a device for introducing the ice crystals into the fluid. The already aforementioned advantages are achieved with such an apparatus.

The apparatus advantageously has at least one nozzle for applying the fluid, with such nozzle preferably being embodied as a wide slot nozzle having a width that is greater than or the same as the width of the substrate. By using such a wide slot nozzle, it is possible in a straightforward manner to ensure that the entire substrate surface that is to be cleaned is covered with the fluid. The apparatus preferably also has a device for tempering the fluid, as a result of which the already aforementioned advantages are achieved.

BRIEF DESCRIPTION OF THE DRAWING

The present invention will be explained in detail subsequently with the aid of preferred specific embodiments in conjunction with the figures.

In the figures.

DESCRIPTION OF PREFERRED EMBODIMENTS

Figure 1:
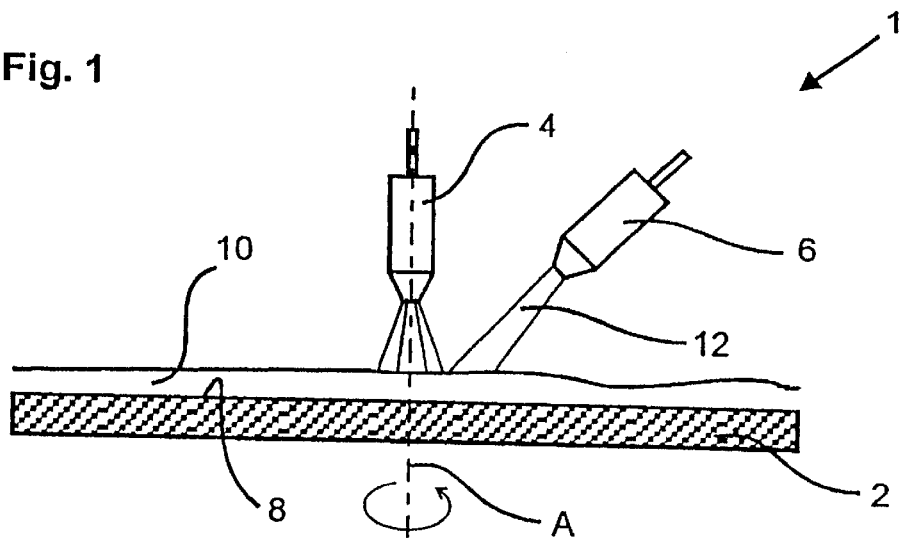
FIG. 1 shows a schematic side view of a substrate cleaning apparatus pursuant to a first specific embodiment of the present invention.

FIG. 1 shows a schematic side view of a cleaning apparatus 1 for semiconductor wafers 2. The cleaning apparatus 1 is provided with a fluid nozzle 4 as well as an ice nozzle 6, which is directed against a surface 8, of the substrate 2, that is to be cleaned. The substrate 2 is held in the cleaning apparatus 1 by a non-illustrated device, and is rotated about a central axis A.

By means of the nozzle 4, a fluid layer 10, which comprises, for example, DI water (deionized water), is centrally applied onto the wafer 2. By rotating the wafer 2, the water layer flows radially outwardly and forms a uniform film upon the surface 8, of the wafer 2, that is to be cleaned.

By means of the ice nozzle 6, a stream 12 of ice crystals is directed against the water layer 10 and is introduced into this layer. The ice crystals are obtained in a known manner in the ice nozzle 6 by sudden expansion of a pressurized gas or liquid and the cooling-off connected therewith. The ice crystals are comprised of a desired, suitable substance in a frozen state.

The temperature of the ice crystals, which can comprise, for example, $CO_2$, is considerably less than the temperature of the water in the layer 10. When the ice crystals penetrate into the water layer 10, they explosively change into gaseous state due to the temperature difference. In so doing, a pulse is generated in the water film which loosens or dislodges particles from the surface 8, of the substrate 2, that is to be cleaned. To ensure a good cleaning of the entire surface 8 of the wafer 2, the ice nozzle 6 is moved radially relative to the substrate 2 from the central axis A to an edge of the wafer. In combination with the rotation of the wafer 2, the cleaning of the entire surface 8 of the wafer 2 is ensured.

Alternative to moving the nozzle 6, the wafer 2 could also be moved linearly relative to the ice nozzle 6 while continuing to be rotated.

Figure 2:
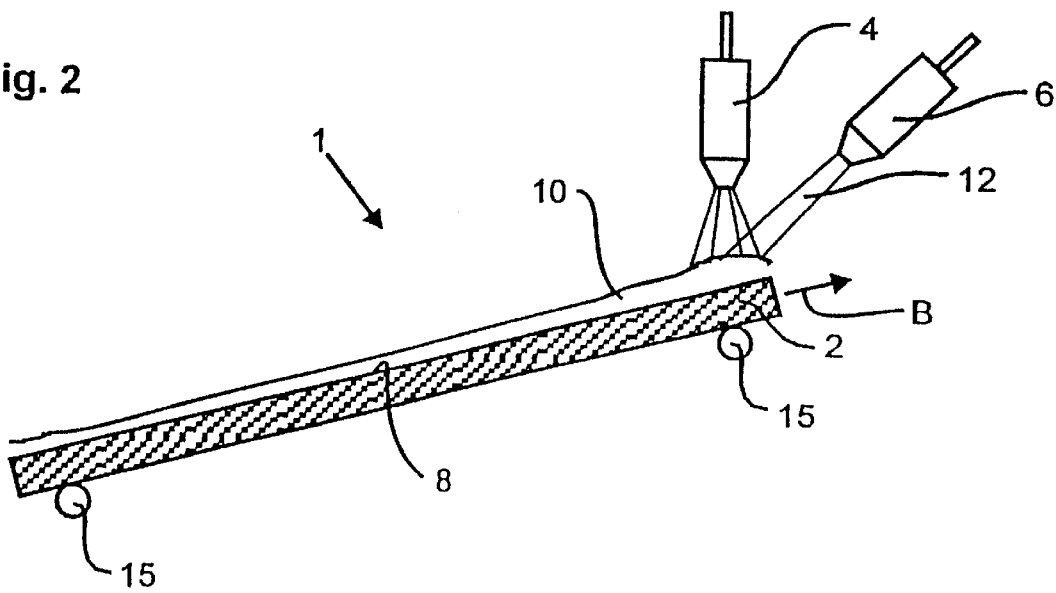
FIG. 2 shows a schematic side view pursuant to a further specific embodiment of the present invention.

FIG. 2 shows an alternative embodiment of the present invention, whereby the same reference numerals are used in FIG. 2 to indicate the same or equivalent components.

The cleaning apparatus 1 of FIG. 2 is again provided with a fluid nozzle 4 as well as an ice nozzle 6, which is directed upon a surface 8, of a wafer 2, that is to be cleaned. The wafer 2 is held via a plurality of rollers 15, two of which are shown, in such a way that the wafer 2 is inclined relative to a horizontal line. Due to the incline of the wafer 2, in FIG. 2, the water film 10 that is applied to the surface 8 that is to be cleaned flows toward the left.

The rollers 15, which hold the wafer 2, are rotatable and enable a linear movement of the wafer 2 in the direction of the arrow B. As a consequence of this linear movement, the wafer 2 is moved through under the fluid nozzle 4 and the ice nozzle 6, as a result of which the entire surface is cleaned. To ensure a cleaning of the wafer 2 over the entire width, the fluid nozzle 4 as well as the ice nozzle 6 are respectively embodied as wide slot or fish tail nozzles that extend over the width of the wafer 2. Alternatively, a plurality of fluid nozzles and ice nozzles that are disposed next to one another, and that have adjoining or overlapping operating ranges, could be provided.

Instead of moving the wafer through, under the nozzles 4 and 6, via the rollers 15, as described above, it is also possible to move the nozzles 4 and 6 relative to the wafer 2, whereby the spacing between the wafer 2 and the wafer surface 8 that is to be cleaned should be maintained.

FIG. 3 again shows a further exemplary embodiment of the present invention, according to which the wafer 2 is held horizontally by a plurality of rollers 18, two of which are shown. As with the embodiment of FIG. 2, the rollers 18 are rotatable and are in a position to move the wafer 2 through, under the nozzles 4 and 6, during the cleaning process. Alternatively, however, the rollers 18 could also be stationary, and the nozzles 4,6 could move linearly over the wafer 2.

Figure 3:
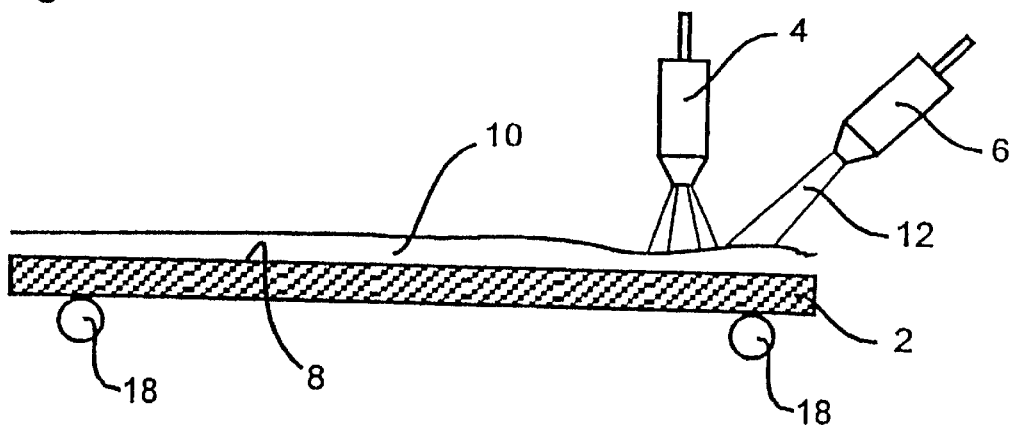
FIG. 3 shows a schematic side view of another specific embodiment of the present invention.
Figure 4:
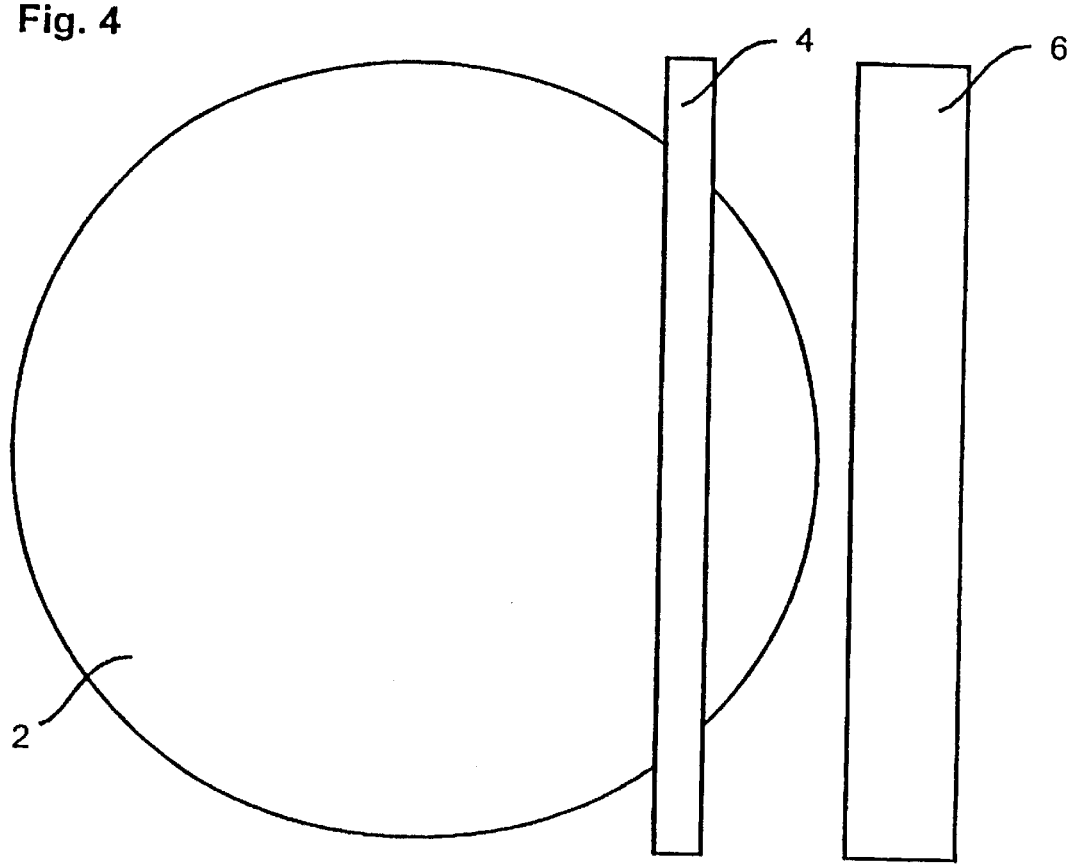
FIG. 4 shows a top view of the specific embodiment of FIG. 3.

FIG. 4 shows a top view upon the exemplary embodiment of FIG. 3, whereby it can be seen that not only the fluid nozzle 4 but also the ice nozzle 6 are embodied as wide slot nozzles having a width that is somewhat greater than the width of the substrate 2 that is to be cleaned.

A cleaning process will subsequently be described with the aid of the exemplary embodiment of FIG. 1.

By means of a non-illustrated handling device, the wafer 2 is brought into the position in the cleaning apparatus 1 shown in FIG. 1. Subsequently, by means of the fluid nozzle 4, DI water is centrally applied to the wafer 2, and the wafer 2 is rotated about the axis A, in order to produce a uniform water layer 10 upon the wafer. By adjusting the rotational speed of the substrate, and the flow volume of the nozzle 4, the thickness of the water layer 10 upon the substrate 2 is controlled.

When a specified layer thickness has been achieved, a stream 12 of ice crystals is blown into the water layer 10 via the ice nozzle 6. In this connection, the nozzle starts blowing ice crystals into the water layer 10 in the region of the central axis A, and the nozzle 6 is subsequently moved in the direction of the outer edge of the wafer 2, so that all regions of the water layer are uniformly bombarded with ice crystals.

The size and the temperature of the ice crystals are controlled by the pressure drop produced in the ice nozzle 6, as well as by a pre-cooling of the $CO_2$ gas or the $CO_2$ liquid. To control the depth of penetration of the ice crystals into the water layer 10, the spacing between the ice nozzle 6 and the water film 10 can be varied. To produce the ice crystals, the ice nozzle can be provided with a plurality of successively arranged nozzles in order to provide a multi-stage cooling.

After the water film 10 has been uniformly bombarded with ice crystals, first the bombardment with ice crystals and subsequently the supply of DI water are terminated. Subsequently, the wafer 2 that has been cleaned in this manner is removed from the apparatus 1.

The cleaning process proceeds in an essentially identical manner in the apparatus of FIGS. 2 to 4, although the wafer 2 is not rotated. The apparatus 1 of FIGS. 2 to 4 can be embodied as so-called continuous run-through stations in which wafers are continuously supplied from one side, are guided through below the cleaning nozzles, and are withdrawn from another side of the apparatus. As shown in the Figures, the wafers can be transported through the apparatus 1 via rotatable rollers 15;18. Alternatively, the wafers can also be transported through the apparatus on an air cushion or in a water stream.

Although the apparatus has been described with the aid of preferred specific embodiments, it is to be noted that the present invention is not limited to the concrete embodiments. In particular, other fluids, such as alcohols, rinsing agents, etc., can be contained in the fluid layer that is disposed upon the wafer. The ice crystals can also have a different composition. In addition to being able to clean semiconductor wafers, the cleaning apparatus is also particularly suitable for masks, components in micro mechanics, CD's, etc.

Furthermore, a cleaning of both sides of substrates is possible with the inventive method and the inventive apparatus, although the preferred embodiments respectively show cleaning on one side. Cleaning on both sides can be effected sequentially or simultaneously.

The specification incorporates by reference the disclosure of German priority document 199 16 345.6 filed Apr. 12, 1999 and International Priority Document PCT/EP00/02339 of Aug. 16, 2000.

The present invention is, of course, in no way restricted to the specific disclosure of the specification and drawings, but also encompasses any modifications within the scope of the appended claims.

I claim:

1. A method of cleaning substrates, comprising the steps of:

prior to, during, or prior to and during a cleaning process, applying fluid onto a substrate surface to form a fluid film thereon;

introducing ice crystals into said fluid film on said substrate surface, wherein said fluid has a first temperature, and wherein said ice crystals have a second temperature that is lower than said first temperature of said fluid such that said fluid changes said ice crystals into a gaseous state to form a pulse generated in said fluid film;

controlling a depth of penetration of said ice crystals into said fluid film such that said ice crystals do not strike said substrate surface; and cleaning said substrate surface with said pulse.

2. A method according to claim 1, which includes the further step of controlling at least one of a thickness of the fluid film, a temperature of said fluid, and a least one of a size and temperature of said ice crystals.

3. A method according to claim 2, wherein said ice crystals are directed at an angle onto said substrate.

4. A method according to claim 2, wherein said ice crystals are generated in at least one ice nozzle that is directed against said substrate.

5. A method according to claim 2, wherein said substrate is rotated about a central axis of said substrate.

6. A method according to claim 2, wherein said substrate is inclined relative to a horizontal line.

7. A method according to claim 2, wherein said fluid comprises deionized water.

8. A method according to claim 2, wherein said ice crystals comprise $CO_2$.

9. A method according to claim 4, wherein a relative movement is produced between said ice nozzle and said substrate.

10. A method according to claim 4, wherein at least one of said substrate and said ice nozzle is moved linearly.

* * * * *